（12）United States Patent
Lostoski et al.

(10) Patent No.: US 8,760,878 B2
(45) Date of Patent: Jun. 24, 2014

(54) FLOATING CIRCUIT BOARD ALIGNMENT

(75) Inventors: Douglas A. Lostoski, Richfield, OH (US); Gary D. Dotson, Muskego, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 377 days.

(21) Appl. No.: 12/858,245

(22) Filed: Aug. 17, 2010

(65) Prior Publication Data

US 2012/0044657 A1 Feb. 23, 2012

(51) Int. Cl.
*H05K 5/00* (2006.01)
*H05K 7/00* (2006.01)
*H05K 1/18* (2006.01)
*F28F 7/00* (2006.01)

(52) U.S. Cl.
USPC .......... 361/752; 361/679.43; 361/679.57; 361/679.58; 361/759; 361/760; 361/770; 165/80.2

(58) Field of Classification Search
USPC ............ 361/679.02–679.45, 679.52, 679.54, 361/748–798; 16/80.2, 80.3, 185
See application file for complete search history.

(56) References Cited

U.S. PATENT DOCUMENTS

| 4,934,943 | A | 6/1990 | Klein et al. |
| 5,313,369 | A | 5/1994 | Lewis et al. |
| 6,409,525 | B1 | 6/2002 | Hoelscher et al. |
| 2004/0018758 | A1* | 1/2004 | Yoshinaga et al. ............ 439/92 |
| 2004/0090747 | A1* | 5/2004 | Wang et al. .................. 361/719 |
| 2006/0120057 | A1* | 6/2006 | Apfelbacher et al. ........ 361/752 |
| 2010/0073861 | A1* | 3/2010 | Takeguchi et al. ....... 361/679.33 |

* cited by examiner

*Primary Examiner* — Jenny L Wagner
*Assistant Examiner* — Jerry Wu
(74) *Attorney, Agent, or Firm* — Amin, Turocy & Watson, LLP

(57) ABSTRACT

Systems and methods are provided that facilitate accurate alignment of internal and external electronic components during assembly of an electronic device such that proper engagement of mating electrical connectors on the respective components is assured. To this end, a floating circuit board carrier mounts to an adaptor plate comprising a surface of the device housing and positions a circuit board such that it "floats" within the device housing. A modular component having posts molded or attached thereto is mounted to the adaptor plate such that the posts pass through clearance holes in the adaptor plate as well as through notches in the circuit board, thereby effecting proper relative alignment of the circuit board and the modular component as electrical connectors on the respective components are engaged.

20 Claims, 6 Drawing Sheets

FLOATING CIRCUIT BOARD ALIGNMENT

TECHNICAL FIELD

The claimed subject matter relates generally to electronic component assembly, and more particularly to a system and method that facilitates accurate alignment between a modular component and a circuit board within an electronic device.

BACKGROUND

Many modern electronic devices comprise a number of electronic components connected together within a device housing to facilitate data exchange or power distribution between the components. These inter-component connections are typically achieved using electrical connectors mounted to the respective devices, such as pin connectors, blade connectors, and the like. Some of these internal electronic components must also interface with modular components affixed to the outside surface of the device housing, such as display screens, keypads, modular logic modules, etc.

As these electrical connections are typically made within the device enclosure, assembly of such devices can be difficult, since final electrical connection between the external modular component and an internal electronic component must be made as the modular component is being mounted to the device housing. The use of a ribbon cable to allow free movement of an electrical connector can make connection between an internal electronic component and an external modular component possible. However, such a solution is not ideal, since the modular component must be held near the device housing as the connection is being made, which can be an awkward and difficult operation if a single person is assembling the device. Moreover, the freedom of movement of the respective connectors can hinder the precise alignment necessary to achieve proper engagement, necessitating a cumbersome trial-and-error approach to achieving proper connection.

In view of these difficulties, there is a need for an assembly design that ensures precise and easy alignment of a modular component with a corresponding electrical component within a device housing prior to engagement of the components' electrical connectors.

SUMMARY

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

One or more embodiments of the present disclosure relate to a device assembly architecture that ensures proper alignment of connecting components within a device housing. To this end, a floating circuit board carrier is provided that can mount a circuit board to an adaptor plate on the rear of the device housing (or to an adaptor plate comprising the rear of the device housing) such that the circuit board "floats" within the housing. A modular component to be mounted to the back of the housing and electrically connected to the circuit board can be provided with posts or pins that correspond with clearance holes in the adaptor plate. The floating circuit board carrier can position the circuit board such that, when the posts or pins on the modular component are aligned with the clearance holes in the device housing or adaptor plate, the mating electrical connectors on the modular component and the circuit board are in alignment. The floating circuit board carrier holds the circuit board at a proper depth within the housing for proper engagement with the modular component connector. To ensure final alignment of the circuit board prior to engagement, the assembly is designed such that the posts of the modular component pass through half-hole notches on two opposite edges of the circuit board, thereby holding the circuit board in the correct orientation as the connectors are mated. This assembly architecture can reduce the problem of aligning and connecting the electrical components within the device to a simple matter of aligning the posts of the modular component with the clearance holes of the device housing.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

Figure 1:
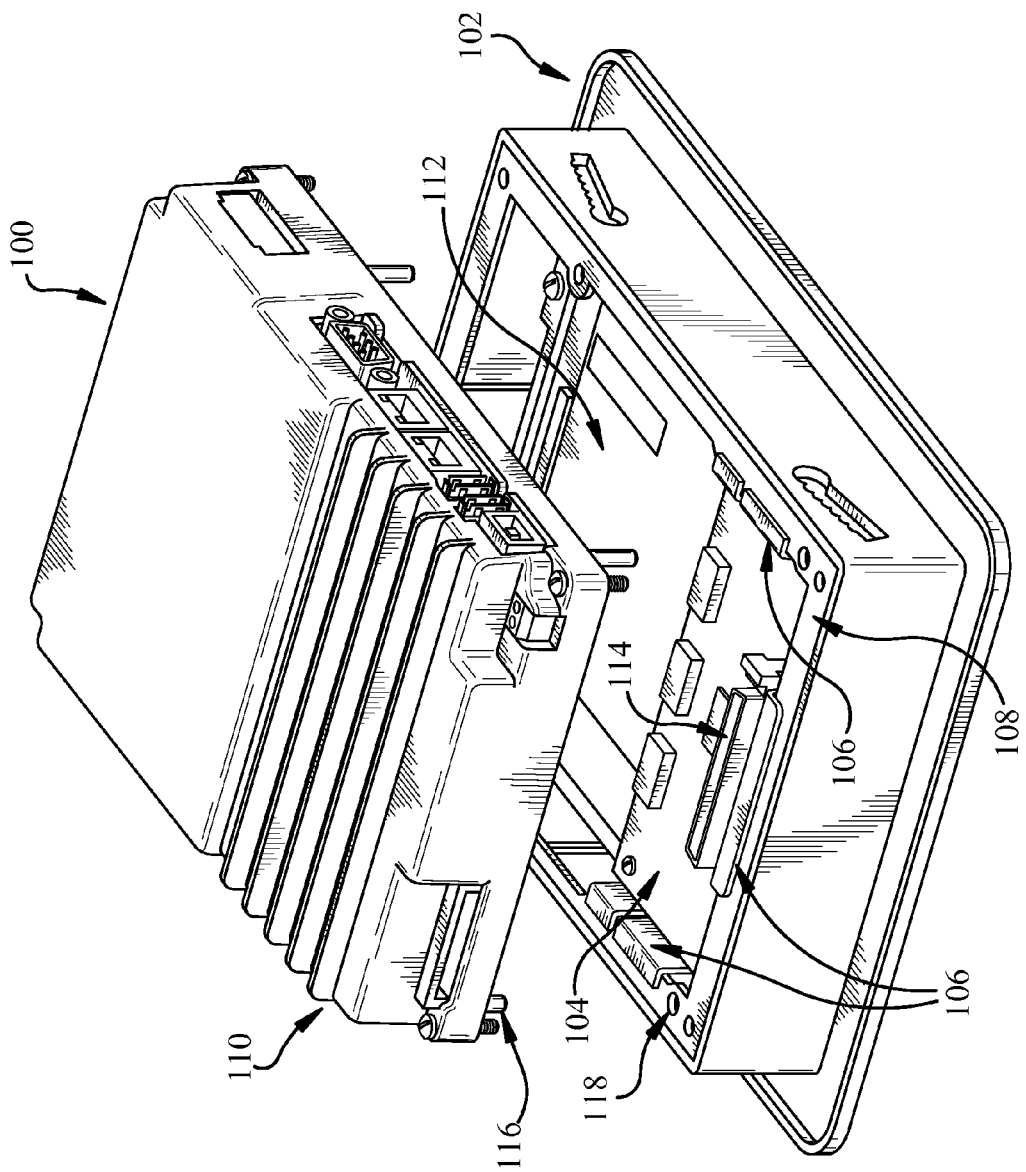
FIG. 1 illustrates an exemplary device that incorporates an embodiment of the subject assembly architecture.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

FIG. 1 illustrates an exemplary device assembly that incorporates an embodiment of the subject assembly architecture. Descriptions of the subject assembly architecture are described herein with reference to an exemplary human-machine interface (HMI) device. However, it is to be appreciated that the mounting architecture of the present invention is not limited to use with such an HMI device, and can be implemented on any suitable electronic device.

HMI assembly 100 comprises an HMI bezel assembly 102 housing a front-mounted display 112. An adaptor plate 108 is mounted on the rear of the bezel assembly. Although this exemplary assembly illustrates the rear of the device housing as comprising adaptor plate 108, it is to be appreciated that one or more embodiments of the subject assembly can be implemented on housings comprising a continuous casting without a removable adaptor plate. Circuit board 104 contains display-specific electronics required for operation of the HMI, and resides within the bezel assembly 102. Logic module 110 contains processing and data storage components that store and execute HMI applications and generally drive operation of the display. Logic module 110 can also include networking ports and components used to connect the display to a network. Logic module 110 is designed to be a modular component that mounts to the rear of bezel assembly 102 and drives operation of display 112 via circuit board 104.

Figure 2:
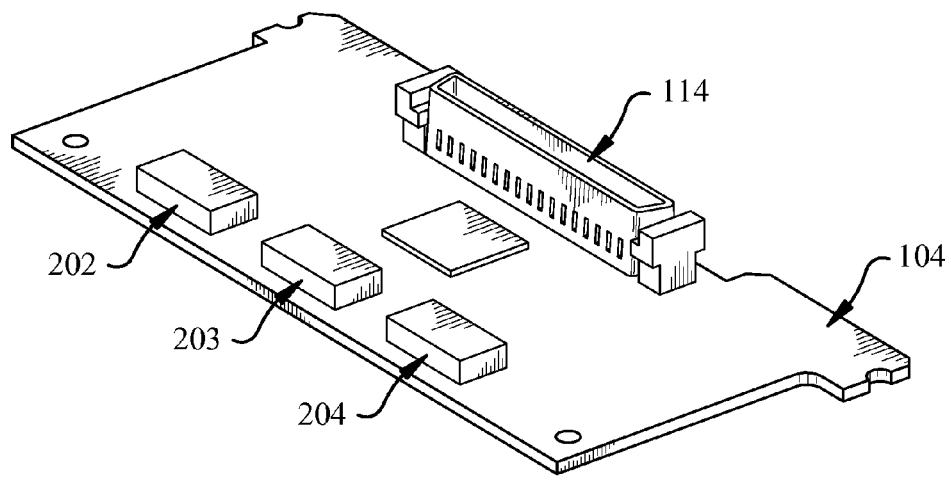
FIG. 2 is a three-dimensional view an exemplary circuit board that can be mounted and aligned using the subject assembly techniques.

Turning briefly to FIG. 2, exemplary circuit board 104 is depicted in more detail. Circuit board 104 can include electrical connectors 202, 203, and 204 that interface with display board 112 within the bezel assembly 102. For example, connectors 202 and 203 can send and receive data relating to the HMI's touchscreen and keypad, respectively, while connector 204 can provide power to the display. It is to be appreciated that this circuit board design and functionality is only intended to be exemplary, and that the assembly techniques described herein are not limited to circuit boards having this physical shape or functionality.

Circuit board 104 also includes connector 114, which physically engages with a corresponding connector on logic module 110 and acts as a data port between circuit board 104 and logic module 110. The mounting architecture of the present application can ensure easy and accurate alignment of the logic module connector with connector 114 during assembly of device 100. Returning now to FIG. 1, circuit board 104 is shown mounted within the bezel assembly using floating circuit board carrier 106. In more detail, circuit board 104 is affixed to floating circuit board carrier 106, which is itself mounted to adaptor plate 108 by attaching the three mounting surfaces of the carrier 106 to three edges of the adaptor plate 108.

Figure 3:
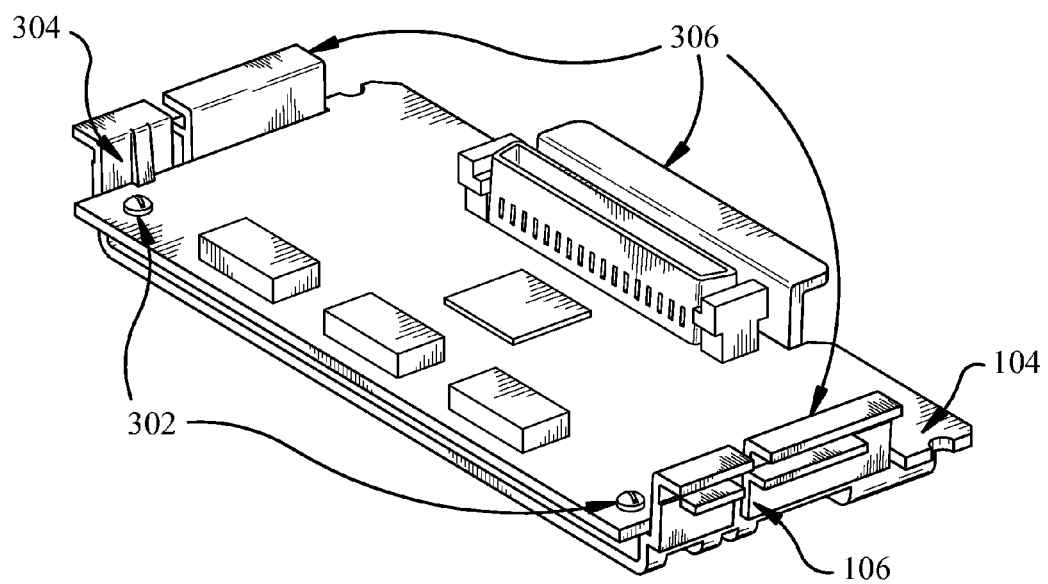
FIG. 3 is a three-dimensional view of an exemplary assembly comprising a circuit board mounted within floating circuit board carrier.

FIG. 3 illustrates a three-dimensional view of an exemplary assembly comprising circuit board 104 mounted within floating circuit board carrier 106. In this exemplary embodiment, mounting screws 302 affix circuit board 104 to the carrier 106. Alternatively or in addition, circuit board 104 can be held to carrier 106 using connectors built into the carrier 106 itself, such as snap connectors 304 or similar spring-loaded connectors. Three mounting surfaces 306 are elevated from the bottom surface of carrier 106. These mounting surfaces 306 allow the carrier to be mounted to three sides of a substantially square cutout in adaptor plate 108, as illustrated in FIG. 1. The fourth side of carrier 106 remains unobstructed to allow access to ports 202, 203, and 204, which can be electrically connected to display board 112 (e.g., via ribbon cables).

Figure 4:
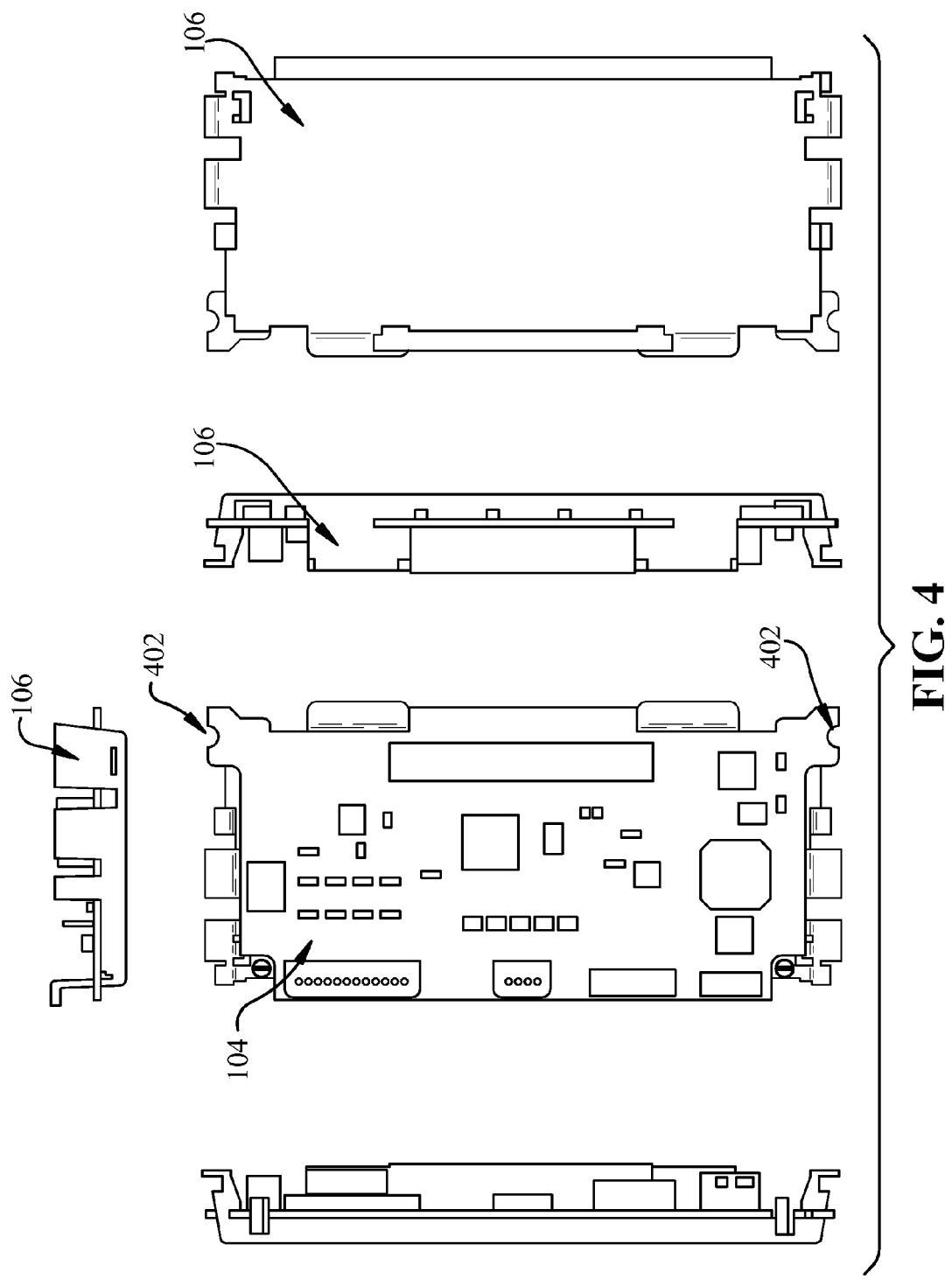
FIG. 4 is a multiview depiction of an exemplary floating circuit board carrier assembly.

FIG. 4 is a multiview depiction of an exemplary floating circuit board carrier assembly. As with the three-dimensional view of FIG. 3, circuit board 104 is shown mounted within carrier 106. As can be seen in the front view, circuit board 104 has been fabricated to include two half-holes 402 at respective two corners of the circuit board. These half-holes 402 are designed to assist with final alignment of circuit board 104, as will be explained infra. The use of half-holes 402 located on the edges of circuit board 104 to facilitate alignment is considered preferable to the use of full-holes located on the surface of the circuit board, since half-holes consume less board surface area while providing substantially similar alignment tolerances as would a full-hole located within the perimeter of the circuit board.

As can be seen in FIG. 1, mounting the floating circuit board carrier 106 to adaptor plate 108 allows circuit board 104 to "float" within the device housing at a proper height to allow connector 114 to engage with the corresponding connector on logic module 110 when the latter is mounted flush with adaptor plate 108. This arrangement also allows unobstructed access to connectors 202, 203, and 204 along the unobstructed edge of carrier 106.

Figure 5:
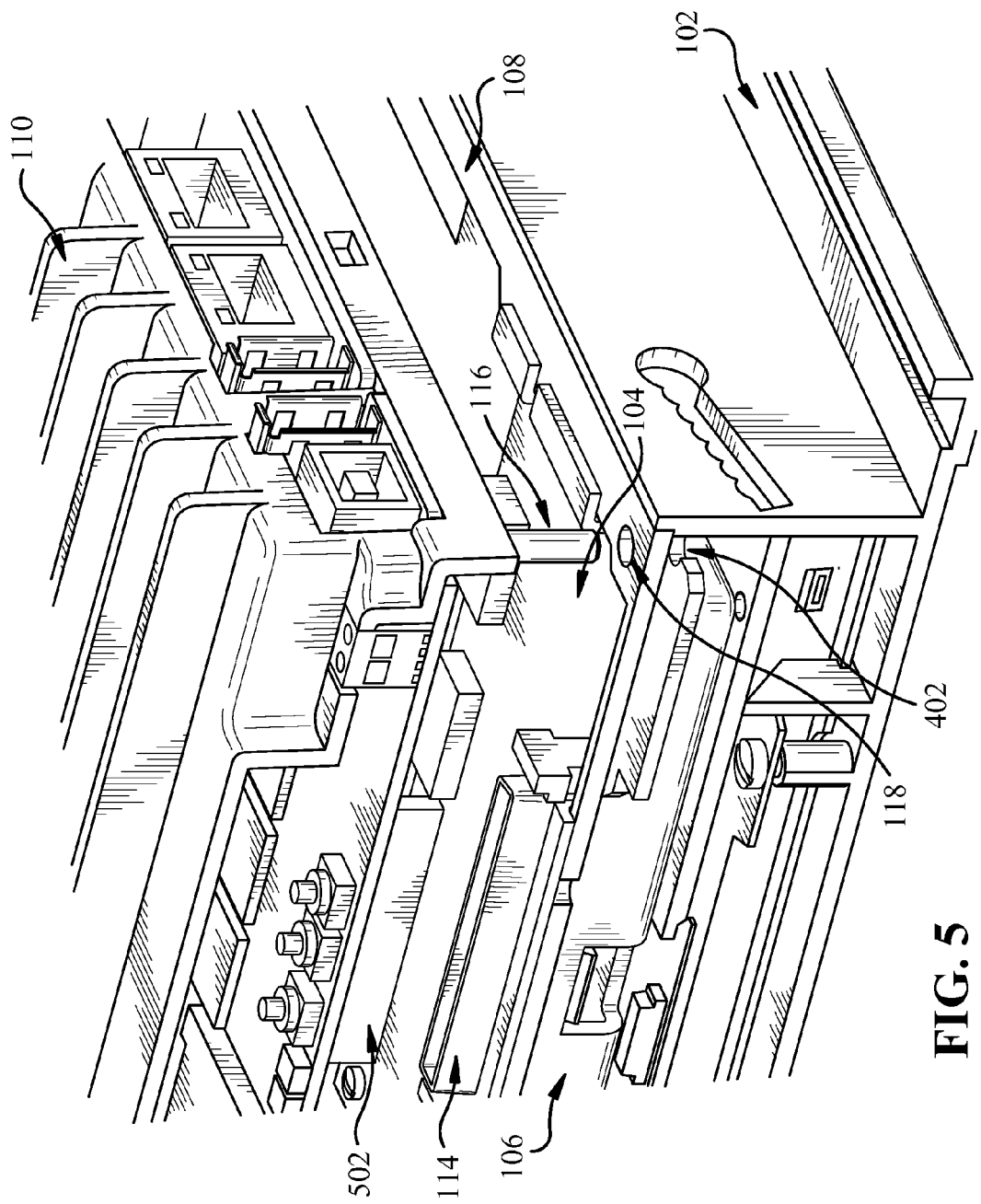
FIG. 5 depicts a section view of a device assembly that facilitates proper alignment of electrical connectors during assembly of a device.

To ensure proper alignment of logic module 110, adaptor plate 108 can be fabricated with a series of clearance holes 118 designed to receive posts 116 on logic module 110. Posts 116 can, for example, comprise posts that are molded as part of the logic module housing, or pins that have been inserted into machined holes within the logic module housing. FIG. 5 depicts a section view of the assembly that illustrates how the assembly architecture discussed herein facilitates proper alignment of electrical connectors during assembly of HMI device 100. Logic module 110 includes electrical connector 502, which must engage with corresponding electrical connector 114 on circuit board 104. Precise relative alignment of logic module 110 and circuit board 104 must be achieved before the connectors 502 and 114 will engage.

To achieve this alignment without the need for trail-and-error positioning of the logic module by an assembler, circuit board 104 is mounted to adaptor plate 108 using floating circuit board carrier 106 such that half-holes 402 are in general alignment with corresponding holes 118 in adaptor plate 108. For device housings comprising a continuous casting that do not employ a removable adaptor plate, holes 118 can be located on the rear of the casting in a similar orientation as shown on the adaptor plate embodiment. As final assembly of logic module 110 and bezel assembly 102 is being performed, posts 116 are inserted into holes 118 in adaptor plate 108, and subsequently through half-holes 402 in circuit board 104. In this way, posts 116 provide proper alignment between bezel assembly 102 and logic module 110, as well as perform a final alignment of circuit board 104 (via half-holes 402) with respect to logic module 110, since posts 116 and half-holes 402 hinder lateral and rotational movement of circuit board 104 as connectors 502 and 114 are brought together. This assembly allows connectors 502 and 114 to mate properly as logic module 110 is mounted flush with adaptor plate 108 without the need for trial-and-error positioning of logic module 110 by an assembler. Moreover, floating circuit board carrier 106 holds circuit board 104 at the proper depth within bezel assembly 102 for proper engagement with connector 502 when logic module 110 is mounted flush with adaptor plate 108.

Figure 6:
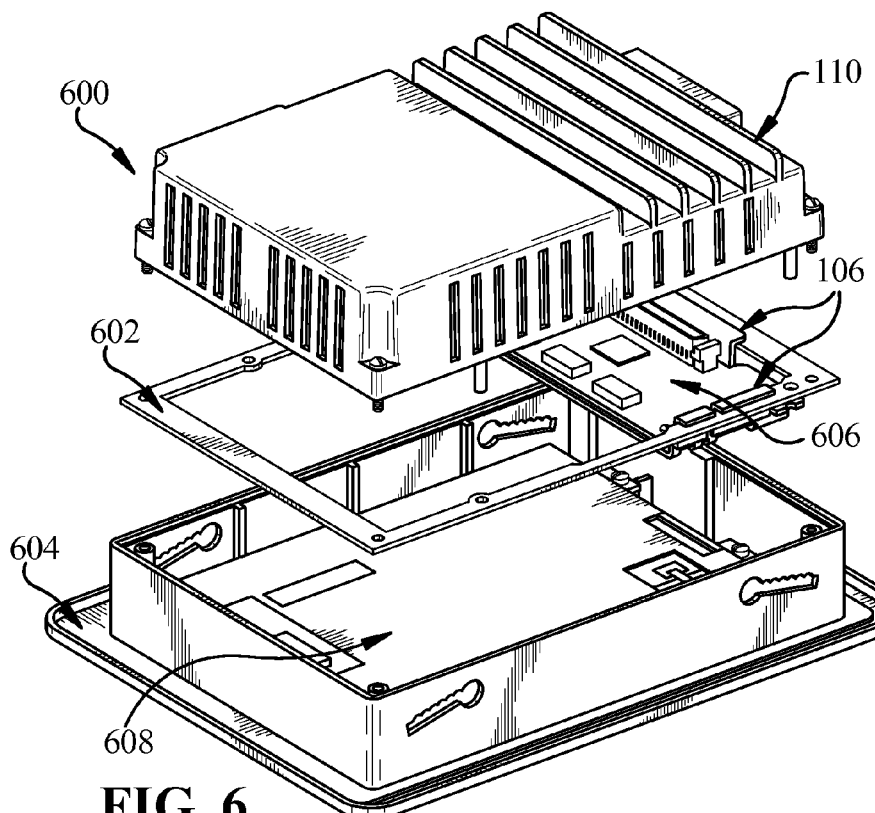
FIG. 6 is an exploded view of an exemplary small sized HMI device that employs an embodiment of the subject assembly architecture.
Figure 7:
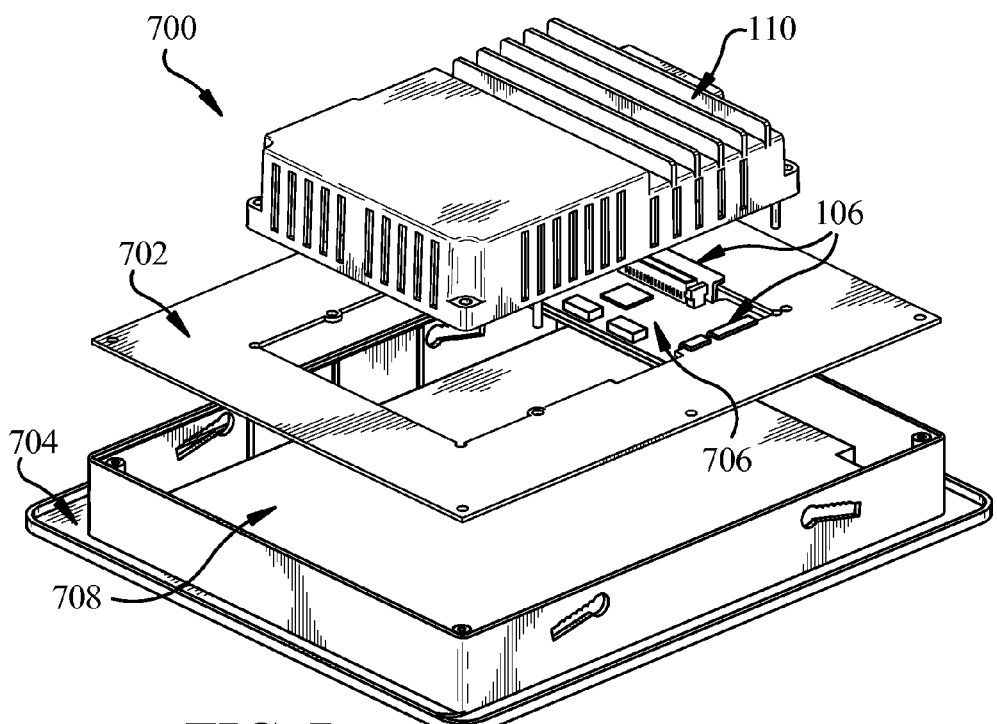
FIG. 7 is an exploded view of an exemplary large sized HMI device that employs an embodiment of the subject assembly architecture.

FIG. 6 and FIG. 7 illustrate how the assembly methods described herein can allow a common assembly architecture to be used across devices of different sizes that employ a common modular component. FIG. 6 depicts an exploded view of an HMI device 600 comprising bezel assembly 604, display board 608, adaptor plate 602, circuit board 606, and logic module 110. Floating circuit board carrier 106 is used to mount circuit board 606 to adaptor plate 602 such that posts on logic module 110 pass through half-holes on two opposite edges of circuit board 606 to facilitate final alignment as logic module 110 is mounted to adaptor plate 602, as described supra. FIG. 7 depicts a similar exploded view for a larger HMI device 700. HMI device 700 comprises a larger display board 708 housed within a larger bezel assembly 704. Despite the differences in size, HMI 600 and HMI 700 both employ the same type of logic module 110, which is common to both HMI designs. In order to scale the mounting methods from the smaller size to the larger size, HMI device 700 can be fitted with an adaptor plate 702 having larger outside dimensions than those of adaptor plate 602, but having a cutout of similar dimensions to that of adaptor plate 602. Circuit board 706, which may comprise electronic components that are specific to HMI device 700, can nevertheless share a common size and shape with circuit board 606 on HMI device 600. Since the adaptor plate cutout, circuit boards, and logic modules are dimensionally similar between the two HMI display sizes, the same general assembly architecture can be employed on both designs to facilitate accurate alignment and assembly of logic module 110 with circuit boards 606 and 706.

Figure 8:
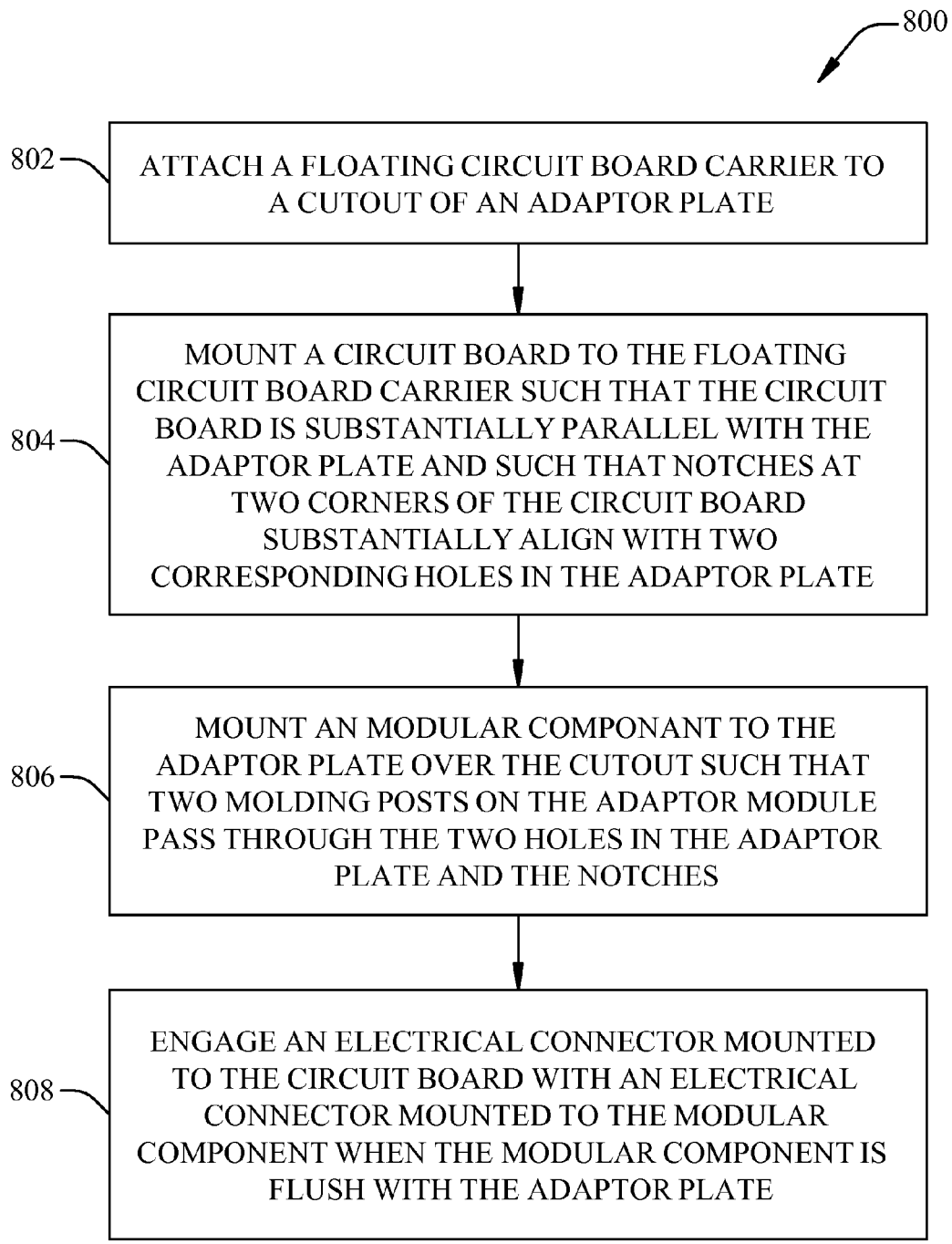
FIG. 8 is a flowchart of an example methodology for aligning a circuit board with a modular component during assembly of an electronic device.

FIG. 8 illustrates a methodology in accordance with the claimed subject matter. While, for purposes of simplicity of explanation, the methodology shown herein is shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies.

FIG. 8 illustrates an example methodology 800 for aligning a circuit board with a modular component during assembly of an electronic device. At 802, a floating circuit board carrier is attached to a cutout of an adaptor plate. The adaptor plate can, for example, comprise the rear surface of a device housing. According to one or more embodiments, the cutout can be substantially square, and the carrier can be attached to three sides of the cutout. At 804, a circuit board is mounted to the floating circuit board carrier such that the plane of the circuit board is substantially parallel with the plane of the adaptor plate. The circuit board can comprise, among other electronic components, an electrical connector intended to engage with a mating electrical connector on a modular component to be attached subsequently. The carrier positions the circuit board such that this electrical connector faces the cutout, and such that the circuit board is held at a level appropriate for proper engagement with the electrical connector on the modular component. The carrier can also position the circuit board such that half-holes at two corners of the circuit board substantially align with two corresponding clearance holes in the adaptor plate.

At 806, the aforementioned modular component is mounted over the cutout. The modular component can include multiple posts that correspond with multiple clearance holes in the adaptor plate to facilitate proper alignment of the modular component with respect to the adaptor plate. To achieve proper relative alignment of the circuit board and the modular component, two of the multiple posts are inserted through the two clearance holes that are substantially aligned with the half-holes in the circuit board. These two posts are sized such that the posts pass through both the clearance holes and the half-holes in the circuit board when the modular component rests flush against the adaptor plate. In this way, the posts provide a common physical reference between the modular component and the circuit board, ensuring proper relative alignment. At 808, the respective electrical connectors on the circuit board and the modular component are engaged when the modular component is flush with the adaptor plate.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

The invention claimed is:

1. An assembly for mounting a circuit board, comprising:
a floating circuit board carrier comprising a bottom surface and at least three mounting surfaces elevated from the bottom surface, wherein the at least three mounting surfaces are configured to mount to respective at least three adjacent edges of a cutout in a surface of a device housing, and the bottom surface is configured to locate the circuit board with respect to the surface of the device housing to align or substantially align two notches located at or near respective two corners of the circuit board with respective two holes located on the surface of the device housing.

2. The assembly of claim 1, wherein the bottom surface of the floating circuit board carrier is configured to hold the circuit board at a distance from the surface of the device housing to allow a first electrical connector built into the circuit board to engage with a second electrical connector built into a modular component when the modular component is mounted flush or substantially flush with the surface of the device housing.

3. The assembly of claim 2, wherein the two holes correspond with respective two posts built into the modular component.

4. The assembly of claim 3, wherein the floating circuit board carrier is configured to locate the circuit board with respect to the surface of the device housing to cause the two posts to pass through the two holes and the notches located at or near the respective two corners of the circuit board.

5. The assembly of claim 1, wherein the surface of the device housing comprises a removable adaptor plate.

6. The assembly of claim 5, wherein the removable adaptor plate is configured to mount to a side of the device housing, and the floating circuit board carrier, when mounted to the removable adaptor plate, causes the circuit board to be disposed inside the device housing.

7. The assembly of claim 5, wherein the device housing comprises a bezel assembly for a human-machine interface device.

8. The assembly of claim 1, wherein the floating circuit board carrier comprises at least one attachment mechanism configured to attach the circuit board to the bottom surface of the floating circuit board carrier, and wherein the at least one attachment mechanism comprises at least one of attachment hardware, one or more snap connectors built into the floating circuit board carrier, or one or more spring-loaded connectors built into the floating circuit board carrier.

9. A method for alignment of electrical connectors in an electronic device, comprising:
attaching at least three mounting surfaces of a floating circuit board carrier to respective at least three adjacent edges of a cutout of a surface of a device housing, wherein the at least three mounting surfaces are elevated with respect to a bottom surface of the floating circuit board carrier; and
mounting a circuit board to the bottom surface of the floating circuit board carrier,
wherein the floating circuit board carrier orients the circuit board to align or substantially align two notches on or near respective two corners of the circuit board with respective two holes located on the surface of the device housing.

10. The method of claim 9, wherein the surface comprises an adapter plate, and the circuit board mounted to the floating circuit board carrier is disposed within the device housing while the adapter plate is mounted to the device housing.

11. The method of claim 9, wherein the mounting the circuit board to the bottom surface of the floating circuit board carrier comprises mounting the circuit board using at least one of attachment hardware, one or more snap connectors built into the floating circuit board carrier, or one or more spring-loaded connectors built into the floating circuit board carrier.

12. The method of claim 9, further comprising:
attaching a modular component having a first electrical connector to the surface of the device housing by inserting two posts projecting from the modular component through the two holes located on the surface of the device housing, wherein the attaching the modular component causes the first electrical connector and a second electrical connector built into the circuit board to be engaged.

13. The method of claim 12, wherein the mounting the circuit board causes the plane of the circuit board to be offset with respect to the surface of the device housing by a distance that allows the first electrical connector to engage with the second electrical connector.

14. The method of claim 12, wherein the mounting the circuit board causes the circuit board to be positioned at a distance from the surface of the device housing that allows the two posts to pass through the notches as the modular component is attached to the surface.

15. An electronic device assembly, comprising:
a device housing having a cutout on a surface; and
a floating circuit board carrier comprising a bottom surface configured to hold a circuit board and at least three mounting surfaces that are elevated with respect to the bottom surface, wherein the at least three mounting surfaces are configured to attach to respective at least three adjacent edges of the cutout, and the floating circuit board carrier is configured to position the circuit board to align or substantially align two notches located on respective opposite edges of the circuit board with respective two holes located on the surface of the device housing.

16. The assembly of claim 15, wherein the surface of the device housing is configured to accept a modular component that mounts to the surface of the device housing over the cutout, two posts on the modular component are inserted through the two holes located on the surface of the device housing, and the two posts run through the two notches on the respective opposite edges of the circuit board.

17. The electronic device assembly of claim 16, wherein the floating circuit board carrier is configured to position the circuit board at a distance from the surface of the device housing that allows a first electrical connector of the circuit board to engage with a second electrical connector of the modular component when the modular component is mounted to the surface of the device housing.

18. The assembly of claim 15, wherein the surface comprises a removable adapter plate.

19. The assembly of claim 15, wherein the device housing comprises a bezel assembly for an operator interface device.

20. The assembly of claim 15, wherein the floating circuit board carrier is configured to hold the circuit board using at least one of attachment hardware, one or more snap connectors, or one or more spring-loaded connectors.

* * * * *